(12) United States Patent
Choi et al.

(10) Patent No.: US 10,797,261 B2
(45) Date of Patent: Oct. 6, 2020

(54) DISPLAY FILM AND DISPLAY DEVICE COMPRISING SAME

(71) Applicant: SAMSUNG SDI CO., LTD., Yongin-si, Gyeonggi-do (KR)

(72) Inventors: Jin Hee Choi, Uiwang-si (KR); Kyoung Ku Kang, Uiwang-si (KR); Si Kyun Park, Uiwang-si (KR); Jung Hyo Lee, Uiwang-si (KR); Sung Han Kim, Uiwang-si (KR); Joo Hui Kim, Uiwang-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 156 days.

(21) Appl. No.: 15/520,050

(22) PCT Filed: Oct. 19, 2015

(86) PCT No.: PCT/KR2015/011054
§ 371 (c)(1),
(2) Date: Apr. 18, 2017

(87) PCT Pub. No.: WO2016/064159
PCT Pub. Date: Apr. 28, 2016

(65) Prior Publication Data
US 2017/0324059 A1  Nov. 9, 2017

(30) Foreign Application Priority Data
Oct. 20, 2014 (KR) .......... 10-2014-0141648

(51) Int. Cl.
*H01L 51/52* (2006.01)
*B32B 27/08* (2006.01)
(Continued)

(52) U.S. Cl.
CPC .......... *H01L 51/5234* (2013.01); *B32B 7/02* (2013.01); *B32B 27/08* (2013.01); *C08J 7/042* (2013.01);
(Continued)

(58) Field of Classification Search
CPC .......... H01L 51/5234; H01L 51/0097; H01L 51/5253; H01L 51/5092; H01L 27/32;
(Continued)

(56) References Cited

U.S. PATENT DOCUMENTS

2009/0281253 A1* 11/2009 Okamoto .......... C08K 5/098
525/474
2009/0311518 A1* 12/2009 Valeri .......... C09D 133/08
428/336
(Continued)

FOREIGN PATENT DOCUMENTS

CN  1347942 A  5/2002
CN  101702891 A  5/2010
(Continued)

OTHER PUBLICATIONS

European Search Report from corresponding European Application No. 15852543.6, European Search Report dated Apr. 20, 2018 (8 pgs.).
(Continued)

*Primary Examiner* — Anthony J Frost
(74) *Attorney, Agent, or Firm* — Lewis Roca Rothgerber Christie LLP

(57) ABSTRACT

The present invention relates to a display film and, more particularly, to a display film comprising a substrate layer and a coating layer formed on one surface of the substrate layer, wherein a first critical radius of curvature measured in a direction in which the side surface of the coating layer becomes concave is at most about 10 mm, and a second
(Continued)

critical radius of curvature measured in a direction in which the side surface of the substrate layer becomes concave is at most about 5 mm. The display film according to the present invention has a high surface hardness while exhibiting superior flexibility in both directions vertical to the plane direction of the film and thus is suitable for application as an outer window film for a display and particularly has the property of being applicable to a flexible display.

11 Claims, 2 Drawing Sheets

(51) Int. Cl.
    *B32B 7/02*       (2019.01)
    *C09D 183/06*    (2006.01)
    *C08J 7/04*       (2020.01)
    *H01L 51/00*     (2006.01)
    *C08G 77/14*      (2006.01)
    *H01L 27/32*      (2006.01)
    *H01L 51/50*      (2006.01)

(52) U.S. Cl.
    CPC ........ *C09D 183/06* (2013.01); *H01L 51/0097* (2013.01); *H01L 51/5253* (2013.01); *C08G 77/14* (2013.01); *C08J 2479/08* (2013.01); *C08J 2483/06* (2013.01); *H01L 27/32* (2013.01); *H01L 51/5092* (2013.01)

(58) Field of Classification Search
    CPC .. B32B 7/02; B32B 27/08; C08J 7/042; C08J 2497/08; C08J 2483/06; C09D 183/06; Y10T 428/10; Y10T 428/1023; Y10T 428/1045
See application file for complete search history.

(56) References Cited

U.S. PATENT DOCUMENTS

| | | | |
|---|---|---|---|
| 2010/0036012 A1* | 2/2010 | Kimura | C08F 2/44 522/172 |
| 2010/0227084 A1* | 9/2010 | Kato | C09K 19/32 428/1.1 |
| 2011/0209901 A1* | 9/2011 | MacDonald | C08J 7/04 174/254 |
| 2013/0331476 A1 | 12/2013 | Bae et al. | |

FOREIGN PATENT DOCUMENTS

| | | |
|---|---|---|
| EP | 2 305 451 A1 | 4/2011 |
| JP | 2007-176542 A | 7/2007 |
| KR | 10-2009-0057597 A | 6/2009 |
| KR | 10-2010-0061396 A | 6/2010 |
| KR | 10-2011-0074677 A | 7/2011 |
| KR | 10-2012-0030012 A | 3/2012 |
| KR | 10-2014-0004568 A | 1/2014 |
| WO | WO 2013/187699 A1 | 12/2013 |

OTHER PUBLICATIONS

International Search Report for corresponding PCT Application No. PCT/KR2015/011054, dated Jan. 25, 2016, with English Translation (5 pages).

Written Opinion for corresponding PCT Application No. PCT/KR2015/011054, dated Jan. 25, 2016 (6 pages).

China Office action in corresponding Chinese Patent Application No. 201580056705.8, China Office action dated Jun. 20, 2018 (7 pgs.).

\* cited by examiner

[FIG. 1]
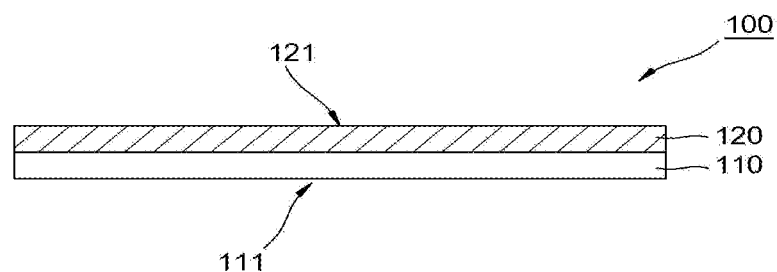
[FIG. 2]
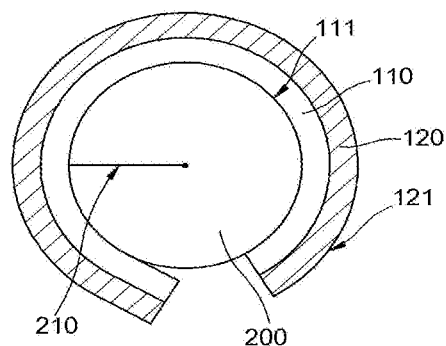
[FIG. 3]
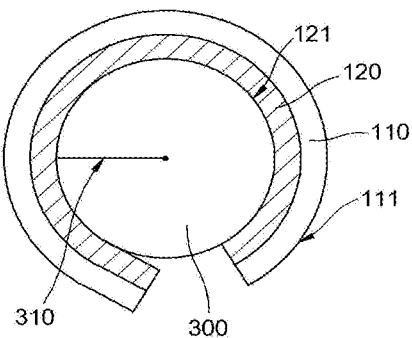

【FIG. 4】
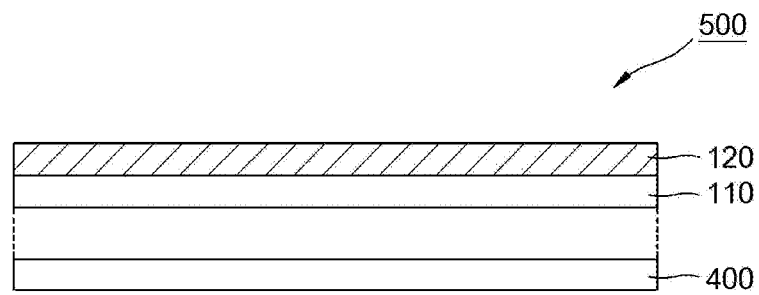
【FIG. 5】
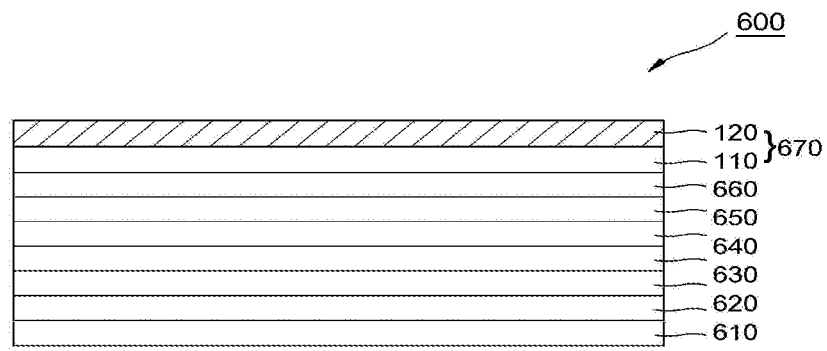

DISPLAY FILM AND DISPLAY DEVICE COMPRISING SAME

This application is a National Phase Patent Application and claims priority to and the benefit of International Application Number PCT/KR2015/011054, filed on Oct. 19, 2015, which claims priority to and the benefit of Korean Application No. 10-2014-0141648, filed on Oct. 20, 2014 the entire contents of each of which are incorporated herein by reference.

BACKGROUND

1. Field

The present invention relates to a display film and a display device comprising the same.

2. Description of the Related Art

Recently, in the field of displays, there is a growing interest in flexible displays that have thin, flexible properties, like paper, and can be bent, folded or rolled. As a result, studies have been continued to develop flexible materials that can be applied to flexible displays. Flexible displays are not only thin and light, but also have impact resistance, can be warped or bent, and can be manufactured into various shapes. In addition, it is an ultimate aim to develop flexible displays that can be restored from a bent state to an original shape and can be folded like paper.

Accordingly, all substrates used in displays have been replaced by flexible films or substrates and, particularly, many studies have been conducted to manufacture window films which will be placed on the surface thereof. However, since the window film disposed at the outermost portion of the display is exposed to external impact or scratching, the window film is required to have high hardness.

When silicon derivatives are coated or deposited on a flexible film, the film can satisfy requirements for high hardness. However, in this case, the film does not exhibit sufficient flexibility to be applied to flexible displays. In addition, although a transparent plastic film comprising a silsesquioxane resin has been proposed as a film having a certain degree of flexibility (Japanese Unexamined Patent Publication No. 2007-176542), the transparent plastic film fails to exhibit sufficient flexibility and is manufactured through a complicated process.

SUMMARY

It is an object of the present invention to provide a display film that exhibits good flexibility in both directions perpendicular to a surface of the film.

It is another object of the present invention to provide a display film that has high hardness while exhibiting good flexibility.

It is a further object of the present invention to provide a display film that has good flatness.

One aspect of the present invention relates to a display film that includes: a base layer; and a coating layer formed on one surface of the base layer, and has a first surface at a base layer side and a second surface at a coating layer side, wherein the first surface has a first critical radius of curvature of about 10 mm or less, as measured in a direction in which the first surface becomes concave, and a second critical radius of curvature of about 5 mm or less, as measured in a direction in which the second surface becomes concave with reference to a display film having a thickness of 100 μm in which the base layer 110 has a thickness of 50 μm and the coating layer 120 has a thickness of 50 μm. The display film may have a pencil hardness of about 5H or more.

Another aspect of the present invention relates to a display device comprising the display film.

The display film according to the present invention exhibits excellent flexibility, particularly in both directions perpendicular to the film surface, exhibits high hardness, and thus provides suitable properties for use as a window film of a display. Since the display film exhibits excellent flexibility in both directions, the display film can be applied to a flexible display to contribute to flexibility of the flexible display, and exhibits good flatness to be advantageous in application to a roll-to-roll process when a coating layer is formed on a base layer.

BRIEF DESCRIPTION OF THE DRAWINGS

FIG. 1 is a schematic sectional view of a display film according to one embodiment of the present invention.

FIG. 2 is a schematic cross-sectional view illustrating a method of measuring a first critical radius of curvature of the display film according to the embodiment of the present invention.

FIG. 3 is a schematic cross-sectional view illustrating a method of measuring a second critical radius of curvature of the display film according to the embodiment of the present invention.

FIG. 4 is a schematic sectional view of a display device according to one embodiment of the present invention.

FIG. 5 is a schematic sectional view of a display device according to another embodiment of the present invention.

DETAILED DESCRIPTION

Hereinafter, embodiments of the present invention will be described in detail. However, it should be understood that the present invention is not limited to the following embodiments and may be embodied in different ways. The following embodiments are provided to provide complete disclosure of the invention and thorough understanding of the present invention to those skilled in the art. The drawings are not to precise scale and some of the dimensions, such as width, length, thickness, and the like, are exaggerated for clarity of description in the drawings. Further, although only a portion of a component is illustrated for convenience of description, other portions of the component will become apparent to those skilled in the art. Furthermore, it should be understood that the present invention can be realized in various ways by those skilled in the art without departing from the spirit and scope of the invention.

A display film according to one embodiment of the present invention will be described with reference to FIG. 1 to FIG. 3. FIG. 1 is a schematic sectional view of a display film according to one embodiment of the present invention. FIG. 2 and FIG. 3 are schematic cross-sectional views illustrating methods of measuring a first critical radius of curvature 210 and a second critical radius of curvature 310 of the display film according to the embodiment of the present invention, respectively.

The display film 100 according to the embodiment of the invention includes a base layer 110; and a coating layer 120 formed on one surface of the base layer, and has a first surface 111 at a base layer side and a second surface 121 at a coating layer side.

According to this embodiment, the display film 100 may have a first critical radius of curvature 210 of about 10 mm or less, specifically about 8 mm or less, more specifically about 5 mm or less, as measured in a direction in which the first surface 111 becomes concave at 20° C. to 30° C. with reference to a display film having a thickness of 100 μm in which the base layer 110 has a thickness of 50 μm and the coating layer 120 has a thickness of 50 μm. In addition, the display film 100 may have a second critical radius of curvature 310 of about 5 mm or less, specifically about 4 mm or less, more specifically about 3 mm or less, as measured in a direction in which the second surface 121 becomes concave under the same conditions. Within these ranges of the first critical radius of curvature and the second critical radius of curvature, the display film can exhibit sufficient flexibility and can be applied to a flexible display.

Referring to FIG. 2 and FIG. 3, the first critical radius of curvature 210 and the second critical radius of curvature 310 are obtained by winding a specimen of a display film, which is a measurement target of the radius of curvature, around a cylindrical jig 200 or 300 for curvature testing, leaving the specimen in the wound state for 10 seconds, followed by checking generation of cracks on the specimen with the naked eye, while changing to jigs with gradually smaller diameters. The minimum radius of a jig, on which the specimen does not suffer from cracking, is defined as the critical radius of curvature, and the first critical radius of curvature 210 is measured by winding the specimen around the jig 200 such that the first surface 111 at the base layer side of the specimen contacts the jig 200, and the second critical radius of curvature 310 is measured by winding the specimen around the jig 300 such that the second surface 121 at the coating layer side of the specimen contacts the jig 300.

In another embodiment, the display film 100 may have a first critical radius of curvature 210 of about 10 mm or less, specifically about 8 mm or less, more specifically about 5 mm or less, as measured in a direction in which the first surface 111 becomes concave at 20° C. to 30° C. with reference to a display film having a thickness of about 40 μm to about 250 μm in which the base layer 110 has a thickness of about 30 μm to about 150 μm and the coating layer 120 has a thickness of about 10 μm to about 100 μm. In addition, the display film 100 may have a second critical radius of curvature 310 of about 5 mm or less, specifically about 4 mm or less, more specifically about 3 mm or less. Within these ranges of the first critical radius of curvature and the second critical radius of curvature, the display film can exhibit sufficient flexibility and can be applied to a flexible display.

According to this embodiment, the display film 100 may have a pencil hardness of about 5H or more, specifically about 7H or more, more specifically about 8H or more. For example, the display film may have a pencil hardness of about 5H to 10H, more specifically about 7H to 9H. Pencil hardness can be measured on a display film having a thickness of about 50 μm to about 150 μm using a pencil hardness/scratch resistance tester (HEIDON, 14FW). Within this range of pencil hardness, the display film can exhibit sufficient scratch resistance and hardness to be applied to a window film.

According to this embodiment, the display film 100 may have a height of about +10 mm to about −10 mm at each of four corners thereof, as measured on a film specimen having a size of 15 cm×15 cm and placed on a flat measurement stage. Within this range, curling of the display film can be controlled and the display film exhibits good flatness.

The display film 100 according to this embodiment has excellent flexibility in both directions perpendicular to the film surface while exhibiting high hardness to satisfy required scratch resistance, flexibility and high strength, and also exhibit good flatness to be applied to a roll-to-roll process.

Next, the base layer 110 and the coating layer 120 of the display film 100 according to this embodiment will be described in more detail.

The base layer 110 may be formed of a polyester resin or a cycloolefin resin. Specifically, the base layer may be formed of at least one selected from among polyimide, modified polyimide, polyethylene terephthalate, polyethylene naphthalate, polybutylene terephthalate, cycloolefin polymer, cycloolefin copolymer, polycarbonate, acrylic, vinyl fluoride, polyamide, polyarylate, cellulose, polyether sulfone, and norbornene resins, without being limited thereto. For example, polyethylene terephthalate, polyimide, and modified polyimide may be used. The base layer 110 may have a thickness of 30 μm and 150 μm. Within this thickness range of the base layer, the display film can exhibit good flexibility.

The coating layer 120 may be formed on one surface of the base layer 110 and may include a siloxane resin.

The coating layer 120 may have a thickness of about 10 μm to about 100 μm, specifically about 20 μm to about 70 μm. Within this thickness range of the coating layer, the display film can exhibit good flexibility and high hardness.

The coating layer 120 may be prepared from a coating composition comprising a siloxane resin having an epoxy group, a reactive monomer, a polyfunctional acrylic oligomer, and an initiator.

The siloxane resin having an epoxy group may be, for example, an alicyclic epoxy group-containing siloxane resin. The alicyclic epoxy group-containing siloxane resin is a UV-curable or heat curable resin, is easy to process due to the presence of the alicyclic epoxy resin therein, and exhibits good surface hardness. Specifically, the alicyclic epoxy group-containing siloxane resin can be prepared through condensation of an alicyclic epoxy group-containing alkoxysilane alone or an alicyclic epoxy group-containing alkoxysilane and a different alkoxysilane having no alicyclic epoxy group, without being limited thereto. Examples of the alicyclic epoxy group-containing alkoxysilane may include 2-(3,4-epoxycyclohexyl)ethyltrimethoxysilane and 2-(3,4-epoxycyclohexyl)ethyltriethoxysilane, without being limited thereto. Examples of the alicyclic epoxy group-containing alkoxysilane may include tetramethoxysilane, tetraethoxysilane, methyltrimethoxysilane, methyltriethoxysilane, methyltripropoxysilane, dimethyldimethoxysilane, dimethyldiethoxysilane, phenyltrimethoxysilane, phenyltriethoxysilane, diphenyldimethoxysilane, diphenyldiethoxysilane, triphenylmethoxysilane, triphenylethoxysilane, ethyltriethoxysilane, propylethyltrimethoxysilane, vinyltrimethoxysilane, vinyltriethoxysilane, vinyltripropoxysilane, N-(3-acryloxy-2-hydroxypropyl)-3-aminopropyltrimethoxysilane, N-(3-acryloxy-2-hydroxypropyl)-3-aminopropyltriethoxysilane, N-(3-acryloxy-2-hydroxypropyl)-3-aminopropyltripropoxysilane, 3-acryloxypropylmethylbis(trimethoxy)silane, 3-acryloxypropyltrimethoxysilane, 3-acryloxypropyltriethoxysilane, 3-acryloxypropyltripropoxysilane, 3-(meth)acryloxypropyltrimethoxysilane, 3-(meth)acryloxypropyltriethoxysilane, 3-(meth)acryloxypropyltripropoxysilane, N-(aminoethyl-3-aminopropyl)trimethoxysilane, N-(2-aminoethyl-3-aminopropyl)triethoxysilane, 3-aminopropyltrimethoxysilane, 3-aminopropyltriethoxysilane, chloropropyltrimethoxysilane, chloropropyltriethoxysilane, and heptadecafluorodecyltrimethoxysilane, without being limited thereto. The alicyclic epoxy group-containing siloxane resin may have a weight average molecular weight (Mw) of about 1,000 g/mol to about 100,000 g/mol, for example, about 2,000 g/mol to about 15,000 g/mol. Within this range, the coating composition can provide good flexibility to the display film. The alicyclic epoxy group-containing siloxane resin may be present in an amount of about 30% by weight (wt %) to about 90 wt %, specifically about 50 wt % to about 85 wt %, more specifically about 65 wt % to about 80 wt %, based on the total weight of the coating composition. Within this range, the coating composition can exhibit suitable viscosity for coating.

The polyfunctional acrylic oligomer may have two to six acrylate groups, specifically two to five acrylate groups, for example, three acrylate groups therein. The presence of the polyfunctional acrylic oligomer allows control of curling upon coating the coating composition onto the base layer and secures good optical properties and hardness. The polyfunctional acrylic oligomer may include at least one selected from the group consisting of urethane acrylate, polyester acrylate, epoxy acrylate, silicone acrylate, acrylic acrylate, melamine acrylate oligomers, and mixtures thereof, without being limited thereto. As used herein, the "oligomer" means a compound having at least two or more repeat units except for polymers. The polyfunctional acrylic oligomer may be present in an amount of about 2 wt % to about 30 wt %, specifically about 3 wt % to about 20 wt %, based on the total weight of the coating composition. Within this range, the coating composition can secure high harness while providing flexibility to the coating layer. The polyfunctional acrylic oligomer may have a weight average molecular weight (Mw) of about 200 g/mol to about 2,000 g/mol. Within this range, the coating composition can secure high harness while providing flexibility to the coating layer.

The reactive monomer may include an acid anhydride monomer, an epoxy group-containing monomer, an oxetane group-containing monomer, or a mixture thereof. The acid anhydride monomer may include tetrahydrophthalic anhydride, hexahydrophthalic anhydride, nadic methyl anhydride, chlorendic anhydride, and pyromellitic dianhydride, without being limited thereto. The epoxy group-containing monomer may include 4-vinylcyclohexene dioxide, cyclohexene vinyl monooxide, (3,4-epoxycyclohexyl)methyl 3,4-epoxycyclohexylcarboxylate, 3,4-epoxycyclohexylmethyl methacrylate, bis(3,4-epoxycyclohexylmethyl)adipate, 3,4-epoxycyclohexanecarboxylate, and 2-(3,4-epoxycyclohexyl)-1,3-dioxolane, without being limited thereto. The oxetane group-containing monomer may include 3-methyloxetane, 2-methyloxetane, 3-oxetanol, 2-methyleneoxetane, 3,3-oxetanedimethanethiol, 4-(3-methyloxetane-3-yl)benzonitrile, N-(2,2-dimethylpropyl)-3-methyl-3-oxetanemethaneamine, N-(1,2-dimethylbutyl)-3-methyl-3-oxetanemethaneamine, (3-ethyloxetane-3-yl)methyl methacrylate, and 4-[(3-ethyloxetane-3-yl)methoxy]butane-1-ol, 3-ethyl-3-hydroxymethyloxetane, 2-ethylhexyloxetane, xylene bisoxetane, and 3-[ethyl-3[[3-ethyloxetane-3-yl]methoxy]methyl]oxetane, without being limited thereto. The reactive monomer may be present in an amount of about 1 to about 40 parts by weight, specifically about 5 to about 20 parts by weight, relative to 100 parts by weight of the epoxy group-containing siloxane resin. In addition, the reactive monomer may be present in an amount of about 1 wt % to about 20 wt %, specifically about 5 wt % to about 15 wt %, based on the total weight of the coating composition. Within this range, the coating composition can have controlled viscosity and secure good processability.

In the coating composition, the epoxy group-containing siloxane resin and the polyfunctional acrylic oligomer may be present in a weight ratio of about 2:1 to 100:1, specifically about 2:1 to 70:1, more specifically about 2:1 to 50:1. Within this range, the coating composition can secure good balance between hardness and flexibility of the display film.

In the coating composition, the polyfunctional acrylic oligomer and the reactive monomer may be present in a weight ratio of about 1:0.1 to 1:10, specifically about 1:0.1 to 1:7, more specifically 1:0.1 to 1:5. Within this range, the coating composition can secure good balance between hardness and flexibility of the display film.

The initiator may be selected from typical initiators and may include at least one of, for example, a photocuring initiator, a heat-curing initiator, and a photo-cationic initiator, without being limited thereto. The photocuring initiator and the heat-curing initiator may be typical initiators. Examples of the photocuring initiator may include triazine, acetophenone, benzophenone, thioxanthone, benzoin, and oxime-based initiators, without being limited thereto. Examples of the photo-cationic initiator may include onium salts, sulfonium salts, and N-containing salts, without being limited thereto. The initiator may be present in an amount of about 0.1 wt % to about 10 wt %, specifically about 1 wt % to about 5 wt %, based on the total weight of the coating composition. Within this range, the coating composition can be sufficiently cured to form a coating layer and does not suffer from deterioration in transparency due to unreacted initiator residue.

The coating composition may further include a solvent in order to secure easy coating. For example, the solvent may be methylethylketone or propylene glycol monomethylether acetate, without being limited thereto.

The coating composition may further include a solvent and additives, such as a photosensitizer, a polymerization inhibitor, a leveling agent, a wettability improver, a surfactant, a plasticizer, a UV absorbent, an antioxidant, and an inorganic filler. These additives may be any typical additives known in the art.

According to another embodiment of the present invention, the coating composition may include an alicyclic epoxy group-containing siloxane resin, a reactive monomer, a polyfunctional acrylic oligomer, a polyfunctional acrylic monomer, and an initiator. Except for the polyfunctional acrylic monomer, the coating composition according to this embodiment is the same as the coating composition according to the above embodiment, and thus the polyfunctional acrylic monomer will now be described in more detail.

The polyfunctional acrylic monomer may include dipentaerythritol hexaacrylate (DPHA), pentaerythritol triacrylate (PETA), tri(2-hydroxyethyl)isocyanurate triacrylate (THEIC), trimethylpropane triacrylate (TMPTA), hexanediol diacrylate (HDDA), and dicyclodecanedimethaneol diacrylate (DCPA), without being limited thereto. The polyfunctional acrylic monomer may be present in an amount of about 0.5 wt % to about 20 wt %, specifically about 5 wt % to about 10 wt %, based on the total weight of the coating composition. Within this range, the coating composition can secure high harness while providing flexibility to the coating layer.

Next, a method of manufacturing a window film according to embodiments of the present invention will be described. A window film according to one embodiment of the present invention may be manufactured by a typical method in which the coating composition according to the embodiments of the invention is coated onto a base layer, followed by curing. For example, a coating solution prepared by diluting the coating composition in a solvent may be coated onto the base layer 110 and cured by UV irradiation. The coating method is not particularly limited and may include, for example, bar coating, slot coating, gravure coating, spin coating, roll coating, dip coating, flow coating, spray coating, and the like. Curing may be performed by exposing the coating composition to UV light having a wavelength of 400 nm or less at a fluence of about 10 mJ/cm$^2$ to about 2000 mJ/cm$^2$. Before curing, the coating layer may be dried at about 60° C. to about 120° C. for about 5 minutes to about 1 hour to increase uniformity of the coating layer.

The display film according to the embodiments may be used as a window film corresponding to an outer layer of a display and may further include a typical antifouling layer and a typical antireflection layer on the coating layer in order to improve antifouling properties and antireflection effects.

Next, a display device according to one embodiment of the present invention will be described with reference to FIG. 4. The display device according to this embodiment may include the display film according to the embodiments of the invention. FIG. 4 is a schematic cross-sectional view of a display device according to one embodiment of the present invention. The display device 500 includes a display member 400 and a display film formed on the display member 400. The display film may be formed on the display member 400 in a direction in which the coating layer 120 becomes an outer layer and may be the display film according to the embodiments described above.

Next, a display device according to another embodiment of the present invention will be described with reference to FIG. 5. The display device according to this embodiment may include the display film according to the embodiments of the invention. The flexible display device according to this embodiment may include a substrate, a device member formed on the substrate, and the display film according to the embodiments of the invention as a window film formed on the device member, which may include an organic light emitting device, liquid crystals, and the like.

Referring to FIG. 5, a flexible display device 600 may include a substrate 610, a device member 620 formed on the substrate 610, a touchscreen panel 640 formed on the device member 620, a polarizer 650 formed on the touchscreen panel 640, and a window film 670 formed on the polarizer 650, in which the display film according to the embodiments may be used as the window film 670.

The substrate 610 may include a transparent material having flexibility. For example, the substrate 610 may be prepared using a polymer film including a polyester resin such as polyethylene terephthalate (PET) and polyethylene naphthalate (PEN), a polycarbonate (PC) resin, a polyether sulfone (PES) resin, a polyimide (PI) resin, a polyacrylate (PAR) resin, a cyclic olefin copolymer (COC) resin, or a poly(meth)acrylate resin such as poly(methyl methacrylate) (PMMA), and a metal film, without being limited thereto.

The device member 620 may be a display member having flexibility, such as an organic light emitting device or liquid crystals, and may be, for example, a TFT-LCD or a TFT-OLED, without being limited thereto. The organic light emitting device may include a first electrode, a second electrode, and an organic light emitting layer interposed between the first electrode and the second electrode. The organic light emitting layer may include a hole injection layer, a hole transfer layer, a light emitting layer, and an electron transfer layer, which are sequentially stacked in the stated order, without being limited thereto.

The touchscreen panel 640 senses a signal generated when a specific position of the display is touched by the finger or a pen, and transmits the signal to the device. The touch signal detects decompression or an electrical signal. An electrode for sensing an electrical signal may include a conductive material having flexibility, for example, a conductive polymer, carbon nanotubes, graphene, metal nanowires, or a combination thereof.

The polarizing plate 650 may serve to polarize external light or internal light by imparting a polarizing function to the display, and may include a polarizer and a protective film.

Adhesive layers 630, 660 are interposed between the substrate 610 and the device member 620 and between the device member 620 and the touchscreen panel 640 to attach the substrate 610 to the device member 620 and the device member to the touchscreen panel 640. Transparent adhesives typically used in the field of adhesives for displays may be used. For example, a transparent adhesive film may be used.

Next, constitution and effects of the present invention will be described in more detail with reference to examples, comparative examples, and experimental examples. However, it should be understood that these examples, comparative examples, and experimental examples are provided for illustration only in order to assist in understanding of the present invention and the present invention is not limited thereto.

Preparation of Coating Compositions 1 to 8

Compounds used in the preparation of the coating compositions are as follows.

(A) Alicyclic epoxy group-containing siloxane resin: Epoxy Hybrimer (Solip Co. Ltd.)

(B) Reactive monomer: Epoxy group-containing monomer CY 179 (Ciba-Geigy Co. Ltd.)

(C) Polyfunctional acrylic oligomer: Trifunctional acrylic oligomer (SR965, Sartomer Co. Ltd.)

(D) Polyfunctional acrylic monomer: Trifunctional acrylic monomer SR494 (Sartomer Co. Ltd.)

(E) Initiator: Irgacure 250 (iodide salt, BASF), CPI-100P (sulfonium, SAN-APRO Co. Ltd.)

Coating Composition 1

Coating composition 1 was prepared by mixing 13.8 g of the reactive monomer (CY 179, Ciba-Geigy Co., Ltd.), 83.5 g of the alicyclic epoxy group-containing siloxane resin (Epoxy Hybrimer, Solip Co., Ltd.), 3 g of the trifunctional acrylate oligomer (SR965, Sartomer Co., Ltd.), and 3 g of the iodide salt initiator (Irgacure 250, BASF).

Coating Composition 2

Coating composition 2 was prepared by mixing 13.5 g of the reactive monomer (CY 179, Ciba-Geigy Co., Ltd.), 81.5 g of the alicyclic epoxy group-containing siloxane resin (Epoxy Hybrimer, Solip Co., Ltd.), 5 g of the trifunctional acrylate oligomer (SR965, Sartomer Co., Ltd.), and 3 g of the iodide salt initiator (Irgacure 250, BASF).

Coating Composition 3

Coating composition 3 was prepared by mixing 12.8 g of the reactive monomer (CY 179, Ciba-Geigy Co., Ltd.), 77 g of the alicyclic epoxy group-containing siloxane resin (Epoxy Hybrimer, Solip Co., Ltd.), 10 g of the trifunctional acrylate oligomer (SR965, Sartomer Co., Ltd.), and 3 g of the iodide salt initiator (Irgacure 250, BASF).

Coating Composition 4

Coating composition 4 was prepared by mixing 11.5 g of the reactive monomer (CY 179, Ciba-Geigy Co., Ltd.), 78.6 g of the alicyclic epoxy group-containing siloxane resin (Epoxy Hybrimer, Solip Co., Ltd.), 20 g of the trifunctional acrylate oligomer (SR965, Sartomer Co., Ltd.), and 3 g of the iodide salt initiator (Irgacure 250, BASF).

Coating Composition 5

Coating composition 4 was prepared by mixing 5 g of the reactive monomer (CY 179, Ciba-Geigy Co., Ltd.), 70 g of the alicyclic epoxy group-containing siloxane resin (Epoxy Hybrimer, Solip Co., Ltd.), 10 g of the trifunctional acrylate oligomer (SR965, Sartomer Co., Ltd.), 5 g of the polyfunctional acrylic oligomer (SR494), and 3 g of the iodide salt initiator (Irgacure 250, BASF).

Coating Composition 6

Coating composition 6 was prepared by mixing 14.3 g of the reactive monomer (CY 179, Ciba-Geigy Co., Ltd.), 86 g of the alicyclic epoxy group-containing siloxane resin (Epoxy Hybrimer, Solip Co., Ltd.), and 4 g of the sulfonium oligomer initiator (CPI-100P, SAN-APRO Co., Ltd.).

Coating Composition 7

Coating composition 7 was prepared by mixing 14.8 g of the reactive monomer (CY 179, Ciba-Geigy Co., Ltd.), 85.2 g of the alicyclic epoxy group-containing siloxane resin (Epoxy Hybrimer, Solip Co., Ltd.), 0.4 g of the trifunctional acrylate oligomer (SR965, Sartomer Co., Ltd.), and 3 g of the iodide salt initiator (Irgacure 250, BASF).

Coating Composition 8

Coating composition 8 was prepared by mixing 13.7 g of the reactive monomer (CY 179, Ciba-Geigy Co., Ltd.), 55.6 g of the alicyclic epoxy group-containing siloxane resin (Epoxy Hybrimer, Solip Co., Ltd.), 38.9 g of the trifunctional acrylate oligomer (SR965, Sartomer Co., Ltd.), and 3 g of the iodide salt initiator (Irgacure 250, BASF).

EXAMPLES AND COMPARATIVE EXAMPLES

Example 1

A coating solution was prepared by mixing the coating composition 1 with 15 g of MEK (Daejung Chemical Co., Ltd.), was deposited on a 50 μm thick PC film (WR-S148, Teijin Chemical Co., Ltd.), dried at 100° C. for 30 minutes, and exposed to UV light at 1,000 mJ, thereby preparing a display film including a 50 μm thick coating film.

Examples 2 to 5 and Comparative Examples 1 to 3

Display films were prepared by the same method as in Example 1 except that the coating compositions 2 to 8 were used as listed in Table 1 instead of the coating composition 1.

Property Evaluation

The properties of the display films prepared in Examples and Comparative Examples were evaluated as follows and results are shown in Table 1.

Critical Radius of Curvature

A specimen of a display film (3 cm×15 cm) was wound around a cylindrical jig for curvature testing at room temperature (25° C.) and left in the wound state for 10 seconds, followed by checking generation of cracks on the specimen with the naked eye. Testing was repeated while changing to jigs with gradually smaller diameters and the minimum radius of a jig, on which the specimen did not suffer from cracking, was defined as the critical radius of curvature. Here, the first critical radius of curvature was measured by winding the specimen around the jig such that the base layer side of the specimen contacted the jig, and the second critical radius of curvature was measured by winding the specimen around the jig such that the coating layer side of the specimen contacted the jig. In this measurement method, a measurable minimum radius was 2 mm, and, when there was no damage to the display film when the display film was bent to have a radius of less than 2 mm measured on a curved surface of the bent display film, 2 mm or less was recorded as a result value.

Pencil Hardness

Pencil hardness was measured using a Shinto Scientific Heidon surface tester (14 FW). The pencil was a Mitsubishi pencil and the tip of the pencil was flattened using #400 sandpaper. With the pencil placed at an angle of 45° with respect to a specimen of a display film (3 cm×15 cm), a weight of 1 kg was raised and moved horizontally by 10 mm. Measurement was repeated five times using the same hardness pencil and, among hardness values where scratches were not visible on the specimen, the highest pencil hardness value was represented as surface hardness of the corresponding specimen (pencil hardness).

Flatness

With film specimens having a size of 15 cm×15 cm placed on a flat measurement stage, height of each of four corners of each of the specimens was measured. A specimen in which all four corners had a height of 10 mm or less was rated as, a specimen in which at least one of the four corners had a height of 10 mm to 15 mm was rated as, and a specimen in which at least one of the four corners had a height of greater than 15 mm was rated as X.

Transmittance

Transmittance was measured using a hazemeter NDA2000. Transmittance values were obtained by measuring at three points of the same sample and averaging.

TABLE 1

| Unit (wt %) | | Example | | | | | Comparative Example | | |
| --- | --- | --- | --- | --- | --- | --- | --- | --- | --- |
| | | 1 | 2 | 3 | 4 | 5 | 1 | 2 | 3 |
| Coating composition | | 1 | 2 | 3 | 4 | 5 | 6 | 7 | 8 |
| Component | (A) | 80.8 | 79.1 | 74.9 | 69.5 | 75.3 | 82.5 | 82.4 | 50 |
| | (B) | 13.4 | 13.1 | 12.5 | 10.2 | 5.4 | 13.7 | 14.3 | 12.3 |
| | (C) | 2.9 | 4.9 | 9.7 | 17.7 | 10.8 | 0 | 0.4 | 35 |
| | (D) | 0 | 0 | 0 | 0 | 5.4 | 0 | 0 | 0 |
| | (E) | 2.9 | 2.9 | 2.9 | 2.6 | 3.2 | 3.8 | 2.9 | 2.7 |
| First critical radius of curvature (mm) | | 8 | 5 | 4 | 4 | 5 | 30 | 26 | 6 |
| Second critical radius of curvature (mm) | | 2 mm or less | 2 mm or less | 2 mm or less | 2 mm or less | 2 mm or less | 2 mm or less | 2 mm or less | 2 mm or less |
| Pencil hardness (H) | | 9 | 6 | 7 | 7 | 8 | 8 | 9 | 2 |

TABLE 1-continued

| Unit (wt %) | Example | | | | | Comparative Example | | |
|---|---|---|---|---|---|---|---|---|
| | 1 | 2 | 3 | 4 | 5 | 1 | 2 | 3 |
| Transparency (transmittance %) | 89.56 | 89.7 | 89.26 | 89.78 | 89.29 | 89.24 | 89.43 | 89.15 |
| Flatness | ○ | ○ | ○ | ○ | ○ | x | x | ○ |

In Table 1, it can be seen that the display films of Examples had high hardness, a first critical radius of curvature of 10 mm or less and a second critical radius of curvature of 5 mm or less, and thus exhibited good properties in terms of flexibility in both directions perpendicular to the film surface, transparency, and flatness. Conversely, the display films of Comparative Examples 1 and 2 had much higher first critical radii of curvature than the display film according to the present invention and poor flatness, and the display film of Comparative Example 3 had low hardness and was not suitable for use as a display film.

The invention claimed is:

1. A display film comprising:
a base layer; and
a coating layer formed on one surface of the base layer, the coating layer comprising a siloxane resin,
the display film having a first surface at a base layer side and a second surface at a coating layer side,
wherein the display film has a first critical radius of curvature of about 10 mm or less, as measured in a direction in which the first surface becomes concave, and a second critical radius of curvature of about 5 mm or less, as measured in a direction in which the second surface becomes concave with reference to a display film having a thickness of 100 μm in which the base layer has a thickness of 50 μm and the coating layer has a thickness of 50 μm, and
wherein the display film has a pencil hardness of about 5H or more,
wherein the coating layer is formed of a coating composition, the coating composition comprising:
an epoxy group-containing siloxane resin;
a reactive monomer comprising at least one selected from an acid anhydride monomer, an epoxy group-containing monomer, and an oxetane group-containing monomer;
a polyfunctional acrylic oligomer, and
an initiator,
wherein a weight ratio of the epoxy group-containing siloxane resin to the polyfunctional acrylic oligomer is about 2:1 to about 100:1, and
wherein the epoxy group-containing siloxane resin is present in an amount of about 30 wt % to about 90 wt % based on a total weight of the coating composition.

2. The display film according to claim 1, wherein the polyfunctional acrylic oligomer has two to six acrylate groups therein.

3. The display film according to claim 1, wherein the polyfunctional acrylic oligomer comprises at least one of urethane acrylate, polyester acrylate, epoxy acrylate, silicon acrylate, acrylic acrylate, and melamine acrylate oligomers.

4. The display film according to claim 1, wherein the coating composition further comprises a polyfunctional acrylic monomer.

5. The display film according to claim 1, wherein the coating composition comprises about 2 wt % to about 30 wt % of the polyfunctional acrylic oligomer.

6. The display film according to claim 1, wherein the coating composition comprises about 1 to about 40 parts by weight of the reactive monomer relative to 100 parts by weight of the epoxy group-containing siloxane resin.

7. The display film according to claim 1, wherein the display film has a first critical radius of curvature of about 5 mm or less and a pencil hardness of about 8H or more.

8. The display film according to claim 1, wherein the base layer comprises a polyimide resin.

9. The display film according to claim 1, wherein the coating layer has a thickness of about 10 μm to about 100 μm.

10. The display film according to claim 1, wherein the base layer has a thickness of about 30 μm to about 150 μm.

11. A display device comprising:
a display member; and
the display film according to claim 1 disposed on the display member.

* * * * *